United States Patent
Ohura et al.

[11] Patent Number: 6,123,799
[45] Date of Patent: Sep. 26, 2000

[54] THERMALLY CONDUCTIVE PRESSURE-SENSITIVE ADHESIVE, ADHESIVE SHEET CONTAINING THE SAME, AND METHOD FOR FIXING ELECTRONIC PART TO HEAT-RADIATING MEMBER WITH THE SAME

[75] Inventors: Masahiro Ohura; Shigeki Muta; Takao Yoshikawa, all of Osaka, Japan

[73] Assignee: Nitto Denko Corporation, Osaka, Japan

[21] Appl. No.: 09/319,229

[22] PCT Filed: Nov. 26, 1997

[86] PCT No.: PCT/JP97/04320

§ 371 Date: Jun. 3, 1999

§ 102(e) Date: Jun. 3, 1999

[87] PCT Pub. No.: WO98/24860

PCT Pub. Date: Jun. 11, 1998

[30] Foreign Application Priority Data

Dec. 4, 1996 [JP] Japan .................................. 8/323741

[51] Int. Cl.[7] .............................. H01L 23/02; B65C 9/20
[52] U.S. Cl. ......................... 156/332; 524/561; 524/562; 524/492; 524/404; 524/443; 524/497; 257/707
[58] Field of Search ..................... 524/561, 562, 524/492, 404, 413, 443, 457; 257/707; 156/332

[56] References Cited

U.S. PATENT DOCUMENTS

| 5,213,868 | 5/1993 | Liberty et al. ............. 428/131 |
| 5,298,791 | 3/1994 | Liberty et al. ............. 257/707 |
| 5,502,085 | 3/1996 | Ohura et al. ............. 522/106 |

FOREIGN PATENT DOCUMENTS

| 0 556 093 A1 | 4/1993 | European Pat. Off. . |
| 566093A | 10/1993 | European Pat. Off. . |
| 62-503174 | 12/1987 | Japan ............. C09J 7/02 |
| 64-33175 | 2/1989 | Japan ............. C09J 3/14 |
| 4-114075 | 4/1992 | Japan ............. C09J 7/02 |
| 6-88061 | 3/1994 | Japan ............. C09J 133/08 |

OTHER PUBLICATIONS

Handbook of Adhesives, 3rd Ed., edited by Skeist, Van Nostrand Reinhold, 1990.

*Primary Examiner*—Robert Dawson
*Assistant Examiner*—Kuo-Liang Peng
*Attorney, Agent, or Firm*—Sughrue, Mion, Zinn, Macpeak & Seas, PLLC

[57] ABSTRACT

In order to provide a heat-conductive pressure-sensitive adhesive which is excellent in heat conductivity and adhesive property, in particular, shows a large adhesive force in a high temperature (heat resisting shear retention force), does not show an extreme viscosity increase during or after the preparation thereof, and is excellent in the stability, the present invention provides a heat-conductive pressure-sensitive adhesive comprising a) 100 parts by weight of a copolymer of a monomer mixture comprising from 70 to 99% by weight of a monomer made up of a (meth) acrylic acid alkyl ester having an alkyl group having from 2 to 14 carbon atoms on an average as the main constituent and from 30 to 1% by weight of a copolymerizable monomer having an acidic or basic polar group in the molecule and b) from 10 to 300 parts by weight of a heat-conductive filler having the same polarity as the polar group of the above-described copolymerizable monomer and having a purity of at least 95% by weight, an adhesive sheet comprising the layer of the heat-conductive pressure-sensitive adhesive on a substrate, and a method of fixing by adhesion an electronic part and a heat-radiating member which comprises fixing by adhering an electronic part and a heat-radiating member by the use of the heat-conductive pressure-sensitive adhesive or the adhesive sheet.

10 Claims, No Drawings

THERMALLY CONDUCTIVE PRESSURE-SENSITIVE ADHESIVE, ADHESIVE SHEET CONTAINING THE SAME, AND METHOD FOR FIXING ELECTRONIC PART TO HEAT-RADIATING MEMBER WITH THE SAME

TECHNICAL FIELD

The present invention relates to a heat-conductive pressure-sensitive adhesive excellent in the heat conductivity and the adhesive property, and in particular, showing a large adhesive force in a high temperature (heat resisting shear retention force), which is used for fixing electronic parts, particularly for fixing an electronic part and a heat-radiating member, and further for fixing other members in various fields such as building materials, vehicles, aircrafts, and ships.

BACKGROUND ART

Hitherto, in electronic parts such as hybrid packages, multimodules, and sealed-type integrated circuits with plastics or metals, with the increase of the integration of IC circuits, the heating value is increased and because there is a possibility of causing the malfunction of electronic parts by the increase of temperature, a countermeasure for preventing the occurrence of the malfunction by attaching a heat-radiating member such as a heat sink, to the electronic part has been taken.

As a method of attaching a heat-radiating member to an electronic part, a method of using an adhesive prepared by adding an aluminum powder to a composition containing a polymerizable acrylic acid ester monomer and a free radical initiator is known as disclosed in U.S. Pat. No. 4,722,960. However, in the method, it is necessary to carry out a heat treatment by using a primer or blocking oxygen after coating the above-described adhesive onto one or both of the electronic part and the heat-radiating member, a long time and much labor are required for the adhering treatment, and it is necessary to temporarily fix the adherend until the adhesive is cured. Thus, the method has a problem in poor production efficiency of electronic devices.

To avoid such a problem, a method of using a so-called heat-conductive pressure-sensitive adhesive having a heat conductivity and a pressure-sensitive adhesive property is known. In the method, the above-described heat-conductive pressure-sensitive adhesive is placed between an electronic part and a heat-radiating member and by utilizing the pressure-sensitive adhesive property, both the members are fixed by adhesion. Thus, the method does not essentially cause the problem of requiring a long time and much labor for the adhering treatment. However, it is considered that, for example, in a certain kind of commercially available heat-conductive pressure-sensitive adhesive tape, an acrylic polymer is used as the adhesive polymer thereof, but in such a heat-conductive pressure-sensitive adhesive tape, there is a difficulty that the pressure-sensitive adhesive tape does not show a good adhesive force to electronic parts and heat-radiating members which are made up of metals having a high polarity, which appears to be attributable to the monomer composition of the above-described acrylic polymer, and is inferior in the adhesive-fixing force between the electronic part and the heat-radiating member.

Also, as other heat-conductive pressure-sensitive adhesive tapes, a pressure-sensitive adhesive tape containing in the pressure-sensitive adhesive layer thereof silver particles having the particle sizes larger than the thickness of the layer (U.S. Pat. No. 4,606,962), a pressure-sensitive adhesive tape wherein heat-conductive electrically insulating particles are randomly dispersed in an acrylic polymer [JP-A-6-88061 (the term "JP-A" as used herein means an "unexamined published Japanese patent application), and EP-566093 A1], etc., are known. These pressure-sensitive adhesive tapes show a relatively good adhesive force to electronic parts having a high polarity but in these tapes, there are problems that the heat-conductive pressure-sensitive adhesive itself is inferior in the stability, that is, during or after the preparation of the pressure-sensitive adhesive, the viscosity thereof is extremely increase to loose the fluidity thereof, whereby the handling property, and, particularly, the coating workability becomes poor, and in the case of forming a pressure-sensitive adhesive tape, the accuracy in the thickness is not obtained as well as, in the worse case, the tape cannot be formed.

As described above, the above-described heat-conductive pressure-sensitive adhesives and the pressure-sensitive tapes using them have the merits that a long time and much labor are not required for the adhering treatment and an electronic part and a heat-radiating member can be easily fixed by adhering, but have the problems that they are inferior in the adhesive-fixing force and are inferior in the stability of the pressure-sensitive adhesives themselves. Accordingly, in the case of applying them to fix electronic parts and heat-radiating members, it has been strongly desired to solve these problems.

In view of these circumstances, an object of the present invention is to provide a heat-conductive pressure-sensitive adhesive being excellent in the heat-conductivity and the adhesive property, particularly, showing a large adhesive force under a high temperature (heat-resisting shear retention force), showing no rapid increase of the viscosity of the pressure-sensitive adhesive during or after the preparation of the adhesive, and also being excellent in the stability and pressure-sensitive adhesive sheets prepared by forming the pressure-sensitive adhesive into sheet forms and tape forms; which are used for fixing electronic parts and heat-radiating members and also for fixing members in other various fields such as building materials, vehicles, aircrafts, and ships.

DISCLOSURE OF THE INVENTION

During the various investigations for attaining the above-described objects, the inventors have obtained the knowledge that first, when in the case of synthesizing an acrylic polymer, a monomer having a polar group, such as acrylic acid, is used as the copolymerization component, an improved adhesive force to electronic parts having a high polarity is obtained but when an alumina ($Al_2O_3$) powder as a typical heat-conductive filler is added to the copolymer, because alumina shows a basic property and, on the other hand, the polar group of the above-described monomer shows an acidic property, both the components cause an acid-basic reaction, whereby the viscosity of the pressure-sensitive adhesive extremely increases to loose the fluidity thereof.

On the ground of such a knowledge, when to the copolymer prepared by using the above-described polar group-containing monomer as the copolymer component is added a heat-conductive filler having the same polarity (acidity) as the polar group of the above-described monomer such as $SiO_2$, $TiB_2$, and BN, it has been clarified that the reaction of the above-described filler and the polar group of the above-described monomer does not occur, thereby avoiding the problem that the fluidity is lost by the increase of the viscosity during or after the preparation of the pressure-sensitive adhesive. As a result, the excellent heat conductivity based on the above-described filler and the excellent adhesive force based on the polar group of the above-described monomer, particularly, a large adhesive force under high temperature (heat-resisting shear retentive force) to electronic parts having a high polarity can be obtained, and a heat-conductive pressure-sensitive adhesive being also excellent in the point of stability can be obtained.

The present invention has been accomplished as the result of further investigating based on the knowledge described above.

That is, the present invention relates to a heat-conductive pressure-sensitive adhesive comprising a) 100 parts by weight of a copolymer of a monomer mixture comprising from 70 to 99% by weight a monomer made up of a (meth) acrylic acid alkyl ester having an alkyl group having from 2 to 14 carbon atoms on an average as the main constituent and from 30 to 1% by weight of a copolymerizable monomer having an acidic or basic polar group in the molecule and b) from 10 to 300 parts by weight of a heat-conductive filler having the same polarity as the polar group of the above-described copolymerizable monomer and having a purity of at least 95% by weight (claims 1 and 2);

an adhesive sheet comprising a substrate having formed on one surface or both the surfaces thereof the layer of the above-described heat-conductive pressure-sensitive adhesive (claims 3, 4, and 5); and a fixing method of an electronic part and a heat-radiating member which comprises fixing by adhering the electronic part and the heat-radiating member via the heat-conductive pressure-sensitive adhesive or the adhesive sheet described above (claim 6).

BEST MODE FOR CARRYING OUT THE INVENTION

In the copolymer as the component a) in the invention, as the main monomer, a (meth)acrylic acid alkyl ester having an alkyl group having from 2 to 14 carbon atoms on an average (i.e., (meth) acrylic acid alkyl esters of which the alkyl groups have from 2 to 14 carbon atoms on an average) is used as the main constituent.

The (meth)acrylic acid alkyl ester having an alkyl group having from 2 to 14 carbon atoms on an average described above includes butyl (meth)acrylate, isononyl (meth) acrylate, isooctyl (meth) acrylate, 2-ethylhexyl (meth) acrylate, and the like. The main monomer made up of the above-described monomer as the main constituent is used at a ratio of from 70 to 99% by weight, and preferably from 90 to 99% by weight. If the content of the main monomer is less than 70% by weight, the adhesive property as the acrylic polymer is reduced.

As the copolymerizable monomer having a polar group in the molecule, which is used together with the main monomer is as follows.

That is, the copolymerizable monomer wherein the above-described polar group is acidic includes carboxyl group-containing monomers such as acrylic acid, methacrylic acid, maleic acid, a caprolactam-modified acrylate, 2-acryloyloxyethyl succinic acid, and 2-acryloyloxyethyl phthalic acid; and hydroxy group-containing monomers such as caprolactam-modified hydroxyethyl (meth)acrylate, 2-hydroxyethyl acrylate, 2-hydroxypropyl acrylate, and 2-hydroxyhexyl acrylate.

Also, the copolymerizable monomer wherein the above-described polar group is basic includes nitrogen-containing monomers such as acrylamide, N-vinyl pyrrolidone, and acryloyl morpholine; vinyl chloride, and vinyl acetate.

The polymerizable monomer having the above-described acidic or basic polar group in the molecule is used in the ratio of from 30 to 1% by weight, and preferably from 10 to 1% by weight in the monomer mixture. If the content of the polymerizable monomer is less than 1% by weight, a good adhesive property based on the above-described polar group of the monomer is hard to obtain, particularly, the adhesive force under a high temperature (heat-resisting shear retentive force) to electronic parts having a high polarity is not improved, and the fixing force by adhesion of an electronic part and a heat-radiating member is inferior.

The copolymer as the component a) in this invention is obtained by copolymerizing the monomer mixture of the main monomer and the copolymerizable monomer described above by a solution polymerization method, an emulsion polymerization method, a suspension polymerization method, a bulk polymerization method, etc. In this case, a proper catalyst such as a thermal polymerization initiator, a photopolymerization initiator, potassium persulfate, ammonium persulfate, hydrogen peroxide, and a redox series initiator made up of the above-described catalyst and a reducing agent.

The thermal polymerization initiator includes organic peroxides such as benzoyl peroxide, t-butyl perbenzoate, cumene hydroperoxide, diisopropyl peroxydicarbonate, di-n-propyl peroxydicarbonate, di(2-ethoxyethyl) peroxydicarbonate, t-butyl peroxyneodecanoate, t-butyl peroxypivalate, (3,5,5-trimethylhexanoyl) peroxide, dipropionyl peroxide, and diacetyl peroxide; azoic compounds such as 2,2'-azobisisobutyronitrile, 2,2'-azobis(2-methylbutyronitrile), 1,1'-azobis (cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate), 4,4'-azobis(4-cyanovaleric acid), 2,2'-azobis(2-hydroxymethylpropionitrile), and 2,2'-azobis[2-(2-imidazolin-2-yl)propane].

Also, the photopolymerization initiator includes acetophenone series compounds such as 4-(2-hydroxyethoxy)-phenyl (2-hydroxy-2-propyl) ketone, α-hydroxy-α,α'-di-methylacetophenone, methoxyacetophenone, 2,2-dimethoxy-2-phenylacetophenone, 2,2'-diethoxyacetophenone, 1-hydroxycyclohexyl phenyl ketone, and 2-methyl-1-[4-(methylthio)-phenyl]-morpholinopropane-1; benzoin ether series compounds such as benzoin ethyl ether, benzoin isopropyl ether, and anizoin methyl ether; α-ketol series compounds such as 2-methyl-2-hydroxypropiophenone; aromatic sulfonyl chloride series compounds such as 2-naphthalenesulfonyl chloride; photoactive oxime series compounds such as 1-phenone-1,1-propanedion-2-(o-ethoxycarbonyl)oxime; benzophenone series compounds such as benzophenone, benzoylbenzoic acid, and 3,3'-dimethyl-4-methoxybenzophenone.

In the above-described polymerization methods, a bulk polymerization method which comprises polymerizing by the irradiation of radiation rays such as ultraviolet rays and electron rays, is preferred. In the polymerization method, there are no troubles such as the corrosion of electronic parts attributable to a residual organic solvent, the occurrences of swelling, releasing, and slipping by the evaporation and expansion at high temperature, staining by bleeding of an emulsifying agent, the occurrence of the inferior adhesion, lowering of the moisture resistance, etc., also the molecular weight of the copolymer can be increased by irradiating ultraviolet rays having a relatively weak intensity, and a pressure-sensitive adhesive having a high crosslinking degree and a large cohesive force, as well as having a particularly good heat resistance can be prepared.

It is necessary that the heat-conductive filler as the component b) in the invention has the same polarity as the polar group of the polymerizable monomer constituting the copolymer of the component a). That is, when the polar group of the above-described monomer is acidic, an acidic heat-conductive filler having the same polarity as the polar group is used and when the polar group of the above-described monomer is basic, a basic heat-conductive filler having the same polarity as the polar group is used.

The above-described acidic heat-conductive filler includes $SiO_2$, $TiB_2$, BN, $Si_3N_4$, $TiO_2$, etc. Also, the basic heat-conductive filler includes MgO, NiO, CuO, $Al_2O_3$, $Fe_2O_3$, etc.

The most preferred combination in this invention is the combination of the copolymerizable monomer constituting the copolymer of the component a), the polar group of which is acidic, particularly is a carboxyl group and the heat-conductive filler as the component b) having the same polarity (acidic) as described above made up of at least one kind selected from $SiO_2$, $TiB_2$, BN, $Si_3N_4$, and $TiO_2$ By the combination, an excellent adhesive property based on the polar group of the above-described monomer, and particularly, a large adhesive force under a high temperature can be obtained and further the increase of viscosity by the acid-base reaction as in conventional cases is avoided and the stability of the pressure-sensitive adhesive becomes very excellent. In addition, as a matter of course, the term "acid-base" described in the specification means "acid-base" treated as so-called "Lewis acid-base".

Such a heat-conductive filler has the above-described specific polarity and also from the view point of avoiding the viscosity increase of the pressure-sensitive adhesive, it is necessary that the purity thereof is at least 95% by weight, and the purity thereof is preferably at least 98% by weight. If the purity of the heat-conductive filler is less than 95% by weight, the viscosity increase is liable to occur by the reaction with impurities of the filler and it sometimes happens that the effects of the present invention are reduced. Also, it is better that the heat-conductive filler has a mean particle size of from 0.5 to 250 $\mu$m, preferably from 1 to 100 $\mu$m, and more preferably from 5 to 30 $\mu$m. The particle form of the heat-conductive filler may be any form such as a spherical form, an a cicular form, a flake form, and a star form. The selection of the form thereof is determined depending on the theological property of the copolymer as the component a) and the rheological property of the final pressure-sensitive adhesive.

In the present invention, it is better that the heat-conductive filler as the component b) is used at a ratio of from 10 to 300 parts by weight, and preferably from 10 to 120 parts by weight to 100 parts by weight of the copolymer as the component a). If the ratio of the heat-conductive filler is less than 10 parts by weight, the pressure-sensitive adhesive having a good heat conductivity is hard to obtain, while if the ratio thereof is more than 300 parts by weight, the adhesive property of the pressure-sensitive adhesive is reduced, the adhesive force under a high temperature greatly lowers, and the adhesive-fixing force becomes poor.

The heat-conductive pressure-sensitive adhesive of the present invention can contain, if necessary, known various additives such as a pigment, other filler, an antioxidant, and a tackifier, in addition to the above-described copolymer as the component a) and the above-described heat-conductive filler as the component b) in the ratios as described above. Also, to improve the heat resistance by increasing the cohesive force as the pressure-sensitive adhesive, a proper crosslinking treatment may be applied by adding an external crosslinking agent or an internal crosslinking agent to the composition for the pressure-sensitive adhesive.

The external crosslinking agent includes polyfunctional isocyanate-based crosslinking agents such as tolylene di-isocyanate, trimethylolpropanetolylene diisocyanate, and diphenylmethanetolylene triisocyanate; epoxy-based crosslinking agents such as polyethylene glycol diglycidyl ether, diglycidyl ether, and trimethylolpropane triglycidyl ether; melamine resin-based crosslinking agents; metal salt-based crosslinking agents; metal chelate-based cross-linking agents; amino resin-based crosslinking agents; peroxide-based crosslinking agents; etc. Each of these external crosslinking agents is added after synthesizing the copolymer, and causes intermolecular crosslinking of the copolymer to increase the cohesive force of the pressure-sensitive adhesive.

The internal crosslinking agent includes polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy (meth)acrylate, polyester (meth)acrylate, and urethane (meth)acrylate. Each of these internal crosslinking agents is added at the synthesis of the copolymer and causes internal crosslinking simultaneously with the polymerization of the copolymer to increase the cohesive force of the pressure-sensitive adhesive.

The adhesive sheet of the present invention is formed by forming the above-described heat-conductive pressure-sensitive adhesive on one surface or both surfaces of a substrate as the form of a sheet form or a tape form.

The substrate used in this invention includes foil-form materials of metals excellent in the heat conductivity, such as aluminum, copper, stainless steels, and a beryllium-copper alloy; sheet-form materials made up of polymers excellent in the heat conductivity by themselves, such as a heat-conductive silicone; heat-conductive plastic films such as polyester, polyimide, each containing a heat-conductive filler. Also, as a plastic film, a film made up of a heat-resisting polymer such as polyimide, polyethylene terephthalate, polyethylene naphthalate, polytetrafluoroethylene, polyether ketone, polyether sulfone, polymethylpentene, polyether imide, polysulfone, polyphenylene sulfide, polyamideimide, polyester imide, and aromatic polyamide, can be also used.

In particular, when the adhesive sheets of this invention are required to have an electrically insulating property, it is preferred to use, for example, the plastic films as described above as the heat-conductive substrate. In the above-mentioned plastic films, from the point of the heat resistance, a polyimide film or a polyamide film is preferred. Also, the plastic film made up of the above-described film containing therein an electrically insulating heat-conductive filler is preferred in the point of the heat conductivity. As the electrically insulating heat-conductive filler, there are $SiO_2$, $TiB_2$, BN, $Si_3N_4$, $TiO_2$, MgO, NiO, CuO, $Al_2O_3$, $Fe_2O_3$, etc. In these fillers, BN or $Al_2O_3$ is particularly preferably used in the points of the heat conductivity and the easiness of availability. These electrically insulating heat-conductive fillers have a mean particle size of usually from 1 to 250 $\mu$m, preferably from 1 to 100 μm, and more preferably from 2 to 10 μm. The particle form may be any form such as a spherical form, an acicular form, a flake form, and a star form. Also, it is better that the using amount thereof is from 2 to 50% by volume, and preferably from 10 to 35% by volume in the film. The thickness of the substrate is usually from 12 μm to 4 mm and also, the thickness of the heat-conductive pressure-sensitive adhesive layer formed on the substrate is usually from 10 to 150 μm.

The production of the adhesive sheet of the present invention can be carried out, for example, by coating the heat-conductive adhesive on a releasing liner, forming the layer of the heat-conductive pressure-sensitive adhesive having a desired thickness by applying a radiation polymerization treatment after the coating, and transferring the layer onto one surface or both surfaces of a substrate. Also, the adhesive sheet may be produced by directly coating the heat-conductive pressure-sensitive adhesive directly on a substrate without using a releasing liner and forming the layer of the heat-conductive pressure-sensitive adhesive by applying a radiation polymerization treatment after the coating. Thus, a proper method can be employed depending on the kind of the substrate, etc.

In the present invention, to fix by adhering an electronic part and a heat-radiating member using the heat-conductive pressure-sensitive adhesive or the adhesive sheet described above, the adhesive material described above is placed between both the materials and they may be fixed by adhesion utilizing the pressure-adhesive property, whereby both the materials can be fixed by a good adhesive strength with a good heat conductivity even under a high temperature.

There is no particular restriction on electronic parts which are fixed by adhering in the present invention, and there are, for example, IC tips, hybrid packages, multi-tip modules, power transistors, and sealed-type integrated circuits with plastics or metals. This invention can be advantageously applied for fixing by adhering an electronic part giving a large heating value, such as highly integrated IC circuits.

Also, as other heat-radiating member which is also the object to be fixed by adhering in this invention, there are heat sinks made up of plates or sheets of the metals illustrated above as the substrates and other radiators, etc. The thickness of the heat sink is generally from 10 μm to 10 mm, preferably from 50 μm to 5 mm, and more preferably from 100 μm to 3 mm although the thickness thereof is not limited to these ranges. Also, the radiator may have a proper structure such as a form having cooling fins.

In addition, the heat-conductive pressure-sensitive adhesive of this invention or the adhesive sheet of this invention formed using the pressure-sensitive adhesive can be applied not only for fixing by adhering an electronic part and a heat-radiating member but also for fixing by adhering other members in various fields such as building materials, vehicles, aircrafts, and ships, and when they are used for the latter purpose, they give, as a matter of course, the same effects as described above.

Then, the present invention is explained more practically by the following examples. In addition, all parts in these examples, unless otherwise indicated, are by weight.

EXAMPLE 1

In 210 parts of ethyl acetate, 95 parts of 2-ethylhexyl acrylate and 5 parts of acrylic acid were subjected to a solution polymerization treatment in the co-existence of 0.4 part of 2,2-azobisisobutyronitrile under a nitrogen gas replacement with stirring at a temperature of from 60 to 80° C. to obtained a copolymer solution having a viscosity of about 120 poise, a polymerization ratio of 99.2% by weight, and a solid component content of 30.0% by weight. To the solution were added 3 parts of a polyfunctional isocyanate-based crosslinking agent and 60 parts of silica ($SiO_2$) (purity 99.8% by weight, mean particle size 1.8 μm) as an acidic heat-conductive filler to 100 parts of the copolymer followed by mixing to prepare a heat-conductive pressure-sensitive adhesive.

The heat-conductive pressure-sensitive adhesive did not show an extreme viscosity increase during or after the preparation thereof and was excellent in the stability. The pressure-sensitive adhesive was coated on a releasing liner made up of a polyester film subjected to a surface treatment with a releasing agent, and after drying in a hot-air dryer for 5 minutes at 40° C., the coated layer was further dried for 5 minutes at 130° C. to form the layer of the heat-conductive pressure-sensitive adhesive having a thickness of 50 μm. By transferring the layer onto both surfaces of a copper foil of 30 μm in thickness as a substrate, an adhesive sheet having a whole thickness of 130 μm was prepared.

EXAMPLE 2

By following the same procedure as Example 1 except that 60 parts of titanium borate ($TiB_2$) (purity 96.2% by weight, mean particle size 7.0 μm) was used as the acid heat-conductive filler, a heat-conductive pressure-sensitive adhesive was prepared. The heat-conductive pressure-sensitive adhesive did not show an extreme viscosity increase during or after the preparation thereof and was excellent in the stability. Using the heat-conductive pressure-sensitive adhesive, an adhesive sheet was prepared by the same manner as in Example 1.

Comparative Example 1

By following the same procedure as Example 1 except that in place of the acidic heat-conductive filler, 60 parts of magnesium oxide (MgO) (purity 97.2% by weight, mean particle size 8.0 μm) was used as a basic heat-conductive filler, a heat-conductive pressure-sensitive adhesive was prepared.

The pressure-sensitive adhesive showed a severe viscosity increase during or after the preparation thereof and was poor in the stability. Thus, using the heat-conductive pressure-sensitive adhesive, the preparation of an adhesive sheet was tried as in Example 1 but a uniform adhesive sheet was not obtained.

EXAMPLE 3

A premix made up of 75 parts of isooctyl acrylate, 20 parts of butyl acrylate, 5 parts of acrylic acid, and 0.1 part of 2,2-dimethoxy-2-phenyl acetone (photopolymerization initiator) was partially polymerized by exposing to ultraviolet rays in a nitrogen gas atmosphere to provide a coatable syrup having a viscosity of about 40 poise. To 100 parts of the syrup were added 0.2 part of trimethylolpropane triacrylate (crosslinking agent) and 40 parts of boron nitride (BN) (purity 99.7% by weight, mean particle size 8.0 μm) as an acidic heat-conductive filler, followed by mixing to prepare a heat-conductive polymerizable composition.

The heat-conductive polymerizable composition did not show an extreme viscosity increase during or after the preparation thereof and was excellent in the stability. The polymerizable composition was coated on a releasing liner made up of a polyester film subjected to a surface treatment with a releasing agent, and was then subjected to a photo-polymerization treatment by irradiating ultraviolet rays of 900 mj/cm² by a high-pressure mercury lamp having a light intensity of 5 mW/cm² in a nitrogen gas atmosphere. The coated layer was dried for 5 minutes at 130° C. in a hot air-circulating dryer to form the layer of a heat-conductive pressure-sensitive adhesive having a thickness of 50 μm. By transferring the layer onto both surfaces of an aluminum foil having a thickness of 30 μm as a substrate, an adhesive sheet having the whole thickness of 130 μm was prepared.

Comparative Example 2

By following the same procedure as Example 3 except that in place of the acid heat-conductive filler, 100 parts of alumina ($Al_2O_3$) (purity 99.7% by weight, mean particle size 3.7 μm) was used as a basic heat-conductive filler, a heat-conductive pressure-sensitive polymerizable composition was prepared. The composition showed a severe viscosity increase during or after the preparation thereof and was poor in the stability. Using the heat-conductive polymerizable composition, the preparation of an adhesive sheet was tried as in Example 3, but a uniform adhesive sheet was not obtained.

Comparative Example 3

By following the same procedure as Example 3 except that 40 parts of boron nitride (BN) (purity 99.7% by weight, mean particle size 8.0 μm) was not used as the acid heat-conductive filler, a heat-conductive polymerizable composition was prepared. The heat-conductive polymerizable composition did not show an extreme viscosity increase during or after the preparation thereof and had a good stability. Using the heat-conductive polymerizable composition, an adhesive sheet was prepared by the same manner as in Example 3.

EXAMPLE 4

A premix made up of 70 parts of isooctyl acrylate, 20 parts of butyl acrylate, 10 parts of acryloylmorpholine, and 0.1 part of 2,2-dimethoxy-2-phenyl acetone (photopolymerization initiator) was partially polymerized by exposing to ultraviolet rays in a nitrogen gas atmosphere to provide a coatable syrup having a viscosity of about 4,000 centipoise. To 100 parts of the syrup were added 0.2 part of trimethylolpropane acrylate (crosslinking agent) and 100 parts of alumina ($Al_2O_3$) (purity 99.7% by weight, mean particle size 3.7 μm) as a basic heat-conductive filler, followed by mixing, to prepare a heat-conductive polymerizable composition.

The heat-conductive polymerizable composition did not show an extreme viscosity increase during or after the preparation thereof and was excellent in the stability. The polymerizable composition was coated on a releasing liner made up of a polyester film subjected to a surface treatment with a releasing agent, and after carrying out a photopoly-merization treatment by irradiating ultraviolet rays of 900 mj/cm² by a high-pressure mercury lamp having a light intensity of 5 mW/cm² in a nitrogen gas atmosphere, the coated layer was dried for 5 minutes at 130° C. in a hot air-circulating dryer to form the layer of a heat-conductive pressure-sensitive adhesive having a thickness of 50 μm. By transferring the layer onto both surfaces of an aluminum foil having a thickness of 30 μm as a substrate, an adhesive sheet having the whole thickness of 130 μm was prepared.

EXAMPLE 5

In 210 parts of ethyl acetate, 95 parts of 2-ethylhexyl acrylate and 5 parts of acrylic acid was subjected to a solution polymerization treatment under the co-existence of 0.4 part of 2,2-azobisisobutyronitrile with stirring at a temperature of from 60 to 80° C. under a nitrogen gas replacement to provide a copolymer solution having a viscosity of about 120 poise, a polymerization ratio of 99.2% by weight, and a solid component content of 30.0% by weight. To the solution were added 3 parts of a polyfunctional isocyanate-based crosslinking agent and 60 parts of silica ($SiO_2$) (purity 99.8% by weight, mean particle size 1.8 μm) as an acidic heat-conductive filler to 100 parts of the copolymer, followed by mixing to prepare a heat-conductive pressure-sensitive adhesive.

The heat-conductive pressure-sensitive adhesive did not show an extreme viscosity increase during or after the preparation thereof and was excellent in the stability. The pressure-sensitive adhesive was coated on a releasing liner made up of a polyester film subjected to a surface treatment with a releasing agent and after drying for 5 minutes at 40° C. in a hot air dryer, the coated layer was further dried for 5 minutes at 130° C. to form the layer of the heat-conductive pressure-sensitive adhesive having a thickness of 50 μm.

EXAMPLE 6

A premix made up of 70 parts of isooctyl acrylate, 20 parts of butyl acrylate, 10 parts of acryloylmorpholine, and 0.1 part of 2,2-dimethoxy-2-phenyl acetone (photopolymerization initiator) was partially polymerized by exposing to ultraviolet rays in a nitrogen gas atmosphere to provide a coatable syrup having a viscosity of about 4,000 centipoise. To 100 parts of the syrup were added 0.2 part of trimethylolpropane triacrylate (crosslinking agent) and 100 parts of alumina ($Al_2O_3$) (purity 99.7% by weight, mean particle size 3.7 μm), followed by mixing to prepare a heat-conductive polymerizable composition.

The heat-conductive polymerizable composition did not show an extreme viscosity increase during or after the preparation thereof and was excellent in the stability. The polymerizable composition was coated on one surface of a polyimide film (thickness 25 μm) containing about 17% by weight $Al_2O_3$, and after carrying out a photopolymerization treatment by irradiating ultraviolet rays of 900 mj/cm² by a high-pressure mercury lamp having a light intensity of 5 mW/cm² in a nitrogen gas atmosphere, the coated layer was dried for 5 minutes at 130° C. in a hot air-circulating dryer to prepare an adhesive sheet (whole thickness 75 μm) having the layer of a heat-conductive pressure-sensitive adhesive having a thickness of 50 μm.

EXAMPLE 7

By following the same procedure as Example 6 except that the heat-conductive polymerizable composition was coated on both surfaces of a polyamide film (thickness 25 μm) containing about 17% by weight $Al_2O_3$, an adhesive sheet (whole thickness 125 μm) was prepared.

About each of the adhesive sheets obtained in Examples 1 to 7 and Comparative Example 3, an adhesive force test under a high temperature (heat-resisting shear retention force test) and a heat resistance test were carried out by the following methods. These results were as shown in Table 1 below.

<Heat-resisting shear retention force test>

The adhesive sheet (width 10 mm) was adhered to one end portion of the lengthwise direction of an aluminum sheet (125 mm×25 mm×0.4 mm) such that the adhered area became 20 mm×10 mm. After allowing to stand for 30 minutes at 80° C., a load of 500 g was applied to the adhesive sheet at 80° C., and whether or not the adhesive sheet was retained for at least 120 minutes without falling was tested. As the result of the test, the case of being retained was evaluated by "○" and the case of not being retained was evaluated by "x".

<Heat-resistance test>

A transistor in a TO-220 package was fixed to a heat sink, which was kept at a constant temperature by immersing in water, using each of the adhesive sheets by adhering at a press-adhering pressure of 2 kg/cm$^2$ or fixing by a jig such as a clip, thereafter a definite amount of an output was supplied to the transistor, and the temperature difference (T2−T1) of the temperature (T2) of the transistor and the surface temperature (T1) of the lower side of the adhesive sheet was measured. From the temperature difference, the heat resistance was calculated by the following formula.

$$\text{Heat resistance } (°C.\cdot cm^2/W) = (T2-T1) \times A/P$$

A: Area (cm$^2$) of the transistor.

B: Consumed electric power (W) of the transistor.

In addition, the temperature (T2) of the transistor was measured by a thermocouple spot-welded to a metal base portion of the transistor package. Also, the surface temperature (T1) of the lower side of the adhesive sheet was measured by forming a fine hole in the heat sink and inserting therein a thermocouple. In this case, the thermocouple was retained as near as possible such that no influence was given to the surface area of the adhesive sheet.

TABLE 1

|  | Heat-Resisting Shear Retention Force Test | Heat Resistance Test (° C. · cm$^2$/W) |
| --- | --- | --- |
| Example 1 | ○ | 6.5 |
| Example 2 | ○ | 3.4 |
| Example 3 | ○ | 3.3 |
| Example 4 | ○ | 6.0 |
| Example 5 | ○ | 3.2 |
| Example 6 | ○ | 3.5 |
| Example 7 | ○ | 4.2 |
| Comparative Example 3 | ○ | 15.0 |

As is clear from the test results of Table 1 described above, it can be seen that each of the adhesive sheets of Examples 1 to 7 of the present invention satisfies the heat-resisting shear retention force and is excellent in the heat conductivity. Also, it can be seen that the heat-conductive pressure-sensitive adhesive used for the preparation of each of the adhesive sheets of Examples 1 to 7 is excellent in the stability during or after the preparation thereof and does not give any hindrance to the coating workability, etc., at the preparation of the adhesive sheet.

INDUSTRIAL APPLICABILITY

As mentioned above, according to the present invention, by employing the construction that an acrylic polymer having an acidic or basic polarity contains a heat-conductive filler having the same polarity as that of the acrylic polymer, a heat-conductive pressure-sensitive adhesive and the adhesive sheets using the pressure-sensitive adhesive, which are excellent in the heat conductivity and the adhesive property, particularly in the adhesive force under a high temperature, and further in the stability can be provided, and they can be widely utilized for fixing electronic parts, in particular, fixing an electronic part and a heat-radiating member, as well as for fixing other members in various fields such as building materials, vehicles, aircrafts, and ships.

What is claimed is:

1. A heat-conductive pressure-sensitive adhesive comprising a) 100 parts by weight of a copolymer comprising from 70 to 99% by weight of a monomer comprising a (meth) acrylic acid alkyl ester having an alkyl group having from 2 to 14 carbon atoms on an average as the main constituent and from 30 to 1% by weight of a copolymerizable monomer having an acidic or basic polar group, and b) from 10 to 300 parts by weight of a heat-conductive filler having the same polarity as the polar group of the copolymerizable monomer and having a purity of at least 95% by weight.

2. A heat-conductive pressure-sensitive adhesive of claim 1 wherein the copolymerizable monomer has an acidic polar group and the heat-conductive filler is at least one filler selected from SiO$_2$, TiB$_2$, BN, Si$_3$N$_4$, and TiO$_2$.

3. An adhesive sheet comprising a substrate having formed on one surface or both surfaces thereof a heat-conductive pressure-sensitive adhesive comprising a) 100 parts by weight of a copolymer comprising from 70 to 99% by weight of a monomer comprising a (meth)acrylic acid alkyl ester having an alkyl group having from 2 to 14 carbon atoms on an average as the main constituent and from 30 to 1% by weight of a copolymerizable monomer having an acidic or basic polar group, and b) from 10 to 300 parts by weight of a heat-conductive filler having the same polarity as the polar group of the copolymerizable monomer and having a purity of at least 95% by weight.

4. An adhesive sheet of claim 3 wherein the substrate comprises a material having excellent heat resistance and heat conductivity.

5. An adhesive sheet of claim 3 wherein the substrate comprises a plastic film containing an electrically insulating and heat conductive filler.

6. A fixing method of an electronic part and a heat-radiating member which comprises fixing by adhering an electronic part and a heat-radiating member via a heat-conductive pressure-sensitive adhesive comprising a) 100 parts by weight of a copolymer comprising from 70 to 99% by weight of a monomer comprising a (meth)acrylic acid alkyl ester having an alkyl group having from 2 to 14 carbon atoms on an average as the main constituent and from 30 to 1% by weight of a copolymerizable monomer having an acidic or basic polar group, and b) from 10 to 300 parts by weight of a heat-conductive filler having the same polarity as the polar group of the copolymerizable monomer and having a purity of at least 95% by weight, or via an adhesive sheet comprising a substrate having formed on one surface or both surfaces thereof said heat-conductive, pressure-sensitive adhesive.

7. An adhesive sheet of claim 3 wherein the copolymerizable monomer has an acidic polar group and the heat-conductive filler is at least one filler selected from SiO$_2$, TiB$_2$, BN, Si$_3$N$_4$, and TiO$_2$.

8. A fixing method of claim 6 wherein the copolymerizable monomer has an acidic polar group and the heat-conductive filler is at least one filler selected from SiO$_2$, TiB$_2$, BN, Si$_3$N$_4$, and TiO$_2$.

9. A fixing method of claim 6 wherein the substrate comprises a material having excellent heat resistance and heat conductivity.

10. A fixing method of claim 6 wherein the substrate comprises a plastic film containing an electrically insulating and heat conductive filler.

* * * * *